United States Patent [19]

McCartney et al.

[11] Patent Number: 5,134,401

[45] Date of Patent: Jul. 28, 1992

[54] DELTA SIGMA MODULATOR HAVING PROGRAMMABLE GAIN/ATTENUATION

[75] Inventors: Damien McCartney; David R. Welland, both of Raheen, Ireland

[73] Assignee: Analog Device, Inc., Norwood, Mass.

[21] Appl. No.: 667,976

[22] Filed: Mar. 12, 1991

[51] Int. Cl.$^5$ ............................................. H03M 3/02
[52] U.S. Cl. .................................. 341/143; 341/172; 333/173
[58] Field of Search ................. 333/173; 307/520, 521, 307/353; 330/278, 279, 280, 281, 144; 341/123, 143, 172

[56] References Cited

U.S. PATENT DOCUMENTS

| | | | |
|---|---|---|---|
| 3,815,033 | 6/1974 | Tewksbury | 341/143 X |
| 4,378,538 | 3/1983 | Gignoux | 333/173 |
| 4,429,285 | 1/1984 | Bradshaw | 330/279 |
| 4,446,438 | 5/1984 | Chang et al. | 333/173 X |
| 4,896,156 | 1/1990 | Gaverick | 341/143 |
| 4,939,516 | 7/1990 | Early | 341/143 |

FOREIGN PATENT DOCUMENTS 63-153907  6/1988  Japan ................................... 333/173

OTHER PUBLICATIONS

Caves, et al.; Sampled Analog Filtering Using Switched Capacitor as Resistor Equivalents; Dec. 1977, IEEE Journal of Solid State Circuits vol. SC12 pp. 592-599.
Hosticka, et al.; MOS Sampled Data Recursive Filters Using Switched Capacitor Integrators; IEEE Journal of Solid State Circuits, vol. SC-12, No. 6 pp. 600-608, Dec. 1977.

Primary Examiner—Howard L. Williams
Attorney, Agent, or Firm—Wolf, Greenfield & Sacks

[57] ABSTRACT

A delta signma modulator is programmable to realize a number of different gain settings. A user of the delta sigma modulator (which may be a human or an electronic system) may select a setting among a plurality of available settings. Programmability of gain is realized by selectively controlling the rate of sampling of an analog input relative to the rate of sampling of a reference voltage and/or by controlling interspersing of samples of fixed voltage with the analog input or reference voltage. To effect a positive gain, the rate of sampling of the analog input is selected to be bar larged than that of the rate of sampling of the known reference voltage. Alternatively, or additionally, fixed voltage charge samples are interspersed with the reference. In contrast, to effect a negative gain, the rate of sampling of the analog input is set to be less than the rate of sampling of the reference voltage and/or samples of fixed voltage are interspersed with the analog input. Lastly, to effect no net gain, the rate of sampling of the analog input is set to be substantially equal to the rate of sampling of the reference voltage.

32 Claims, 5 Drawing Sheets

DELTA SIGMA MODULATOR HAVING PROGRAMMABLE GAIN/ATTENUATION

RELATED APPLICATIONS

This application concerns subject matter related to co-pending application "Two Phase Sampling for a Delta Siqma Modulator" by Damien McCartney and David R. Welland filed on even date herewith. This co-pending application is expressly incorporated by reference herein.

FIELD OF THE INVENTION

The present invention relates generally to analog to digital converters and, more particularly, to delta sigma modulators.

BACKGROUND OF THE INVENTION

Delta sigma modulators provide analog-to-digital (A/D) conversion with high resolution. Such modulators (also know as sigma delta modulators) provide A/D conversion by employing a combination of oversampling techniques and noise shaping techniques. U.S. Pat. No. 4,588,981, entitled "Double Integration, Delta Sigma, Analog Digital Coder", issued on May 13, 1986 to Senn, provides a detailed discussion of one such delta sigma modulator. The delta sigma modulator described in that patent is depicted in FIG. 1.

The delta sigma modulator 10 of FIG. 1 includes an input 12 to which an analog input E(P) is applied. Typically, the analog input E(P) has a frequency ranging from DC to several kilohertz. The delta sigma modulator 10 is provided with an inverting switched capacitor circuit 67 (i.e., switches 28, 30, 32, 34 and capacitor C3) that oversamples the analog input, typically at a rate ranging from several kilohertz to several megahertz.

The delta sigma modulator 10 also includes a first integrator 18 formed from an amplifier 19 and an integration capacitor C5. The non inverting input of the amplifier 19 is tied to ground, whereas the inverting input is coupled to inverting switched capacitor circuit 67 and to an additional inverting switched capacitor circuit 63. The additional inverting switched capacitor circuit 63 includes switches 36 38, 40 and 42 and a capacitor C1. This additional inverting switched capacitor circuit 63 samples the output signal S(P) of the modulator 10 and feeds back corresponding charge packets to the integration capacitor C5. The central role of circuit 63 is as a feedback mechanism that helps to stabilize the modulator 10.

The first integrator 18 produces an output corresponding to the amount of charge dumped from capacitors C3 of circuit 67 and C1 of circuit 63 onto the integration capacitor C5. The delta sigma modulator 10 also includes a second integrator 20 comprised of a second operational amplifier 64 and a second integration capacitor C8. Inverting switched capacitor circuit 61 forwards a signal to the inverting input of the amplifier 64. The mean amplitude of this signal is proportional to the amplitude of the output signal S(P). Inverting switched capacitor circuit 61 comprises switches 15, 17, 19 and 21 and capacitor C4. The non inverting input of the amplifier 64 is tied to ground.

The second integrator 20 is preferably used in conjunction with switched capacitor circuit 61 and a switched capacitor circuit 93 as a filter that cooperates with the first integrator 18 to shape the noise at the output of the modulator, to facilitate later digital filtering of the output. The switched capacitor circuit 93 includes switches 52, 54, 60 and 62 and capacitor C2. This switched capacitor circuit 93 passes a signal from the output of the first integrator 18 onto the inverting input of the amplifier 64.

The output of the second integrator 20 is connected to the D input of a quantization circuit, realized in FIG. 1 as a D type flip-flop 73. The reference voltages $+V_{ref}$ and $-V_{ref}$ are applied to the D flip flop 73 and constitute the possible values of the S(P) output signal. The clock input Ck of the flip-flop 73 receives a timing signal H$_2$, provided by a timing circuit 69 which determines S(P) (i.e., $+V_{ref}$ or $-V_{ref}$). The digital output signal S(P) is produced from the inverted output Q* of flip flop 73.

The operation of delta sigma modulator 10 will be explained with reference to FIG. 2. Initially, at time T$_1$, timing circuit 69 sets control signal H$_1$ high. For the present discussion, when a control signal is high, the switch receiving the control signal is closed, and when the control signal is low, the switch is open. Hence, in circuit 67, switches 28 and 34 close in response to the high level of control signal H$_1$. Switches 30 and 32, on the other hand, are responsive to control signal H$_2$, which is set low by timing circuit 69 at time T$_1$; accordingly, switches 30 and 32 are open. This switch configuration causes the capacitor C3 to be charged to the level of the voltage of the analog input. At time T$_2$ switches 28 and 34 are opened by timing circuit 69 setting control signal H$_1$ low, while switches 30 and 32 are closed by timing circuit 69 setting control signal H$_2$ high. This switch configuration causes the voltage across capacitor C3 to be impressed on the summing node VN1.

The control signals H$_1$ and H$_2$ issued by the timing circuit 69 also control the switches in circuit 63. For the circuit 63, switches 36 and 42 are controlled by the control signal H$_1$, whereas switches 38 and 40 are controlled by the control signal H$_2$. Hence, at time T$_1$, capacitor C1 begins charging and at time T$_2$, capacitor C$_1$ begins discharging. Thus, these control signals control the timing of the switches in these circuits 63 and 67 so that capacitor C3 and capacitor C1 charge and discharge together.

Since both circuits 63 and 67 dump packets of charge onto the integration capacitor C5, the output produced from the first integrator 18 is indicative of the net charge that these circuits dump onto capacitor C5. In particular, since the non inverting input of the amplifier 19 is tied to ground, this configuration provides an output signal that is proportional to the integral of the voltage at the input of the integrator 18. Accordingly, the output will reflect the cumulative effect of the charge packets of the sampled analog input and the charge packets fed back into the first integrator 18 from switched capacitor circuit 63.

Output from the integrator 18 is sampled by inverting switched capacitor circuit 93. The timing of the operation of the inverting switched capacitor circuit 93 is synchronized with the timing of the operation of the circuit 61. Specifically, at time T$_1$ (see FIG. 2), switches 52 and 60 are open (because control signal H$_2$ is low) while switches 54 and 62 are closed (because control signal H$_1$ goes high). This switch configuration causes the discharging of the capacitor C2. At time T$_2$, however, switches 52 and 60 are closed by control signal H$_2$ going high, whereas switches 54 and 62 are opened by asserting control signal $H_1$ low. In this switch configuration, capacitor C2 charges.

The output from inverting switched capacitor circuit 93 is supplied to the inverting input of amplifier 64 of the second integrator 20. Also connected to this inverting input is the output from inverting switched capacitor circuit 61 at a second summing node VN2. This circuit 61 comprises switches 15, 17, 19 and 21 and capacitor C4. Its control timing signals are synchronized with timing signals of input sampling circuit 93. Capacitor C2 and capacitor C4 begin charging at time $T_2$ and begin discharging at time $T_4$ when $H_1$ goes high again. The output produced from the circuit 61 has a mean amplitude that is proportional to the mean amplitude of the output S(P).

The second integrator 20 receives the charges from circuits 61 and 93. It produces an output indicative of the amount of charge that is passed to it. The resulting output signal is passed to the D type flip flop 73 wherein the output signal is quantized to produce the signal S(P).

"Gain" refers to the increase in signal level across the delta sigma modulator from input node 12 to output node 74 and is given as the ratio of mean output voltage to input voltage. "Attenuation" refers to the decrease in signal level across the modulator. From hereinafter, gain and attenuation will be referred to solely as gain. A problem suffered by conventional delta sigma modulators such as that depicted in FIG. 1 is that the gain cannot be readily adjusted. The gain is dictated by the ratio of the capacitances of the capacitors C3/C1. The amount of gain is controlled by capacitances because the capacitances dictate the amount of charge that is dumped for each sample. Hence, in such systems, to modify the gain, one must change the capacitances of the capacitors. This typically requires actual physical replacement of the capacitors, which can be burdensome and time-consuming.

It is, therefore, an object of the present invention to provide a delta sigma modulator having programmably adjustable and distinct gain settings, including attenuator settings.

It is a further object of the present invention to provide a delta sigma modulator wherein the gain/attenuation is established without the need for adjusting the capacitances of capacitors contained therein.

SUMMARY OF THE INVENTION

The foregoing and other objects are achieved in a delta sigma modulator which is programmable for a number of different gain settings (in this context, gain settings include attenuation settings). The delta sigma modulator includes an integrating amplifier circuit having an integration capacitor and an amplifier. A first electrical lead of the integration capacitor is coupled to the output of the amplifier and a second electrical lead of the integration capacitor is tied to an input of the amplifier. The integrating amplifier circuit produces output indicative of an amount of charge held on its capacitor.

The delta sigma modulator further includes a means for sampling an analog input signal to produce corresponding "analog input" packets of charge and for forwarding the analog input charge packets to the integration capacitor of the integrating amplifier circuit at a first rate. This means for sampling the analog input may take a variety of forms, but one preferred form is that of a switched capacitor circuit. The switched capacitor circuit includes a capacitor and a plurality of switches for alternately charging and discharging the capacitor so as to sample the analog input.

The delta sigma modulator also includes a means for sampling a predetermined reference voltage or voltages to provide positive or negative reference packets of charge. Hereinafter, reference will generally be made only to a single reference voltage, but it should be appreciated that multiple references are equally viable in the described instances. This means for sampling the reference voltage may also be realized as a switched capacitor circuit having at least one capacitor and switches for alternately charging and discharging the capacitor. When additional reference voltages are used, additional means for sampling may be used to sample the additional reference voltages. The means for sampling the reference voltage forwards the reference charge packets to the integration capacitor of the integrating amplifier circuit at a second rate.

The packets of charge from the mean for sampling the analog input and from the means for sampling the reference voltage are dumped on the integration capacitor of an integrator. The integrator produces an output corresponding to the amount of charge dumped onto the integration capacitor.

The delta sigma modulator additionally includes a control means. The control means controls the operation of at least one sampling means by supplying thereto control signal to operate the various switches at the above described first rate or attenuation second rate. Preferably, the control means (which may be human or machine) is programmable so that a user of the delta sigma modulator may select a particular level of gain. Once the desired level of gain or is selected by the user, the programmable control means may generate an appropriate combination of switch control signals at appropriate (selectable values of) first and second rates to realize this selected gain. Further, gain may also be realized by interspersing samples of a fixed voltage with samples of the analog input or with samples of the reference voltage. For instance, to achieve attenuation, samples of ground may be interspersed with the samples of analog input. Plural samples of the fixed voltage may be sent for each sample of analog input or vice versa. Still further, one can adjust the sampling rates and intersperse fixed voltage sampl in conjunction to realize a given gain.

BRIEF DESCRIPTION OF THE DRAWING

The above invention will be more fully described with reference to the accompanying figures.

DETAILED DESCRIPTION

In accordance with the present invention, a delta sigma modulator 81 (FIG. 3) is programmable to different gain settings, which include settings for attenuation. A user of the delta sigma modulator 81 of the present invention may programmably select the desired gain or attenuation from among a number of different possible gain settings. The delta sigma modulator 81, however, does not rely on altering the capacitances of capacitors within the modulator to adjust the gain; instead, it adjusts the rate of sampling of the analog input relative to the rate of sampling of a reference voltage and/or it intersperses samples of a fixed voltage with samples of the analog input or with samples of a known reference voltage. As will be explained below in more detail, by selecting the relative sampling rates in this fashion, the delta sigma modulator 81 is able to establish a selectable level of gain.

Figure 3:
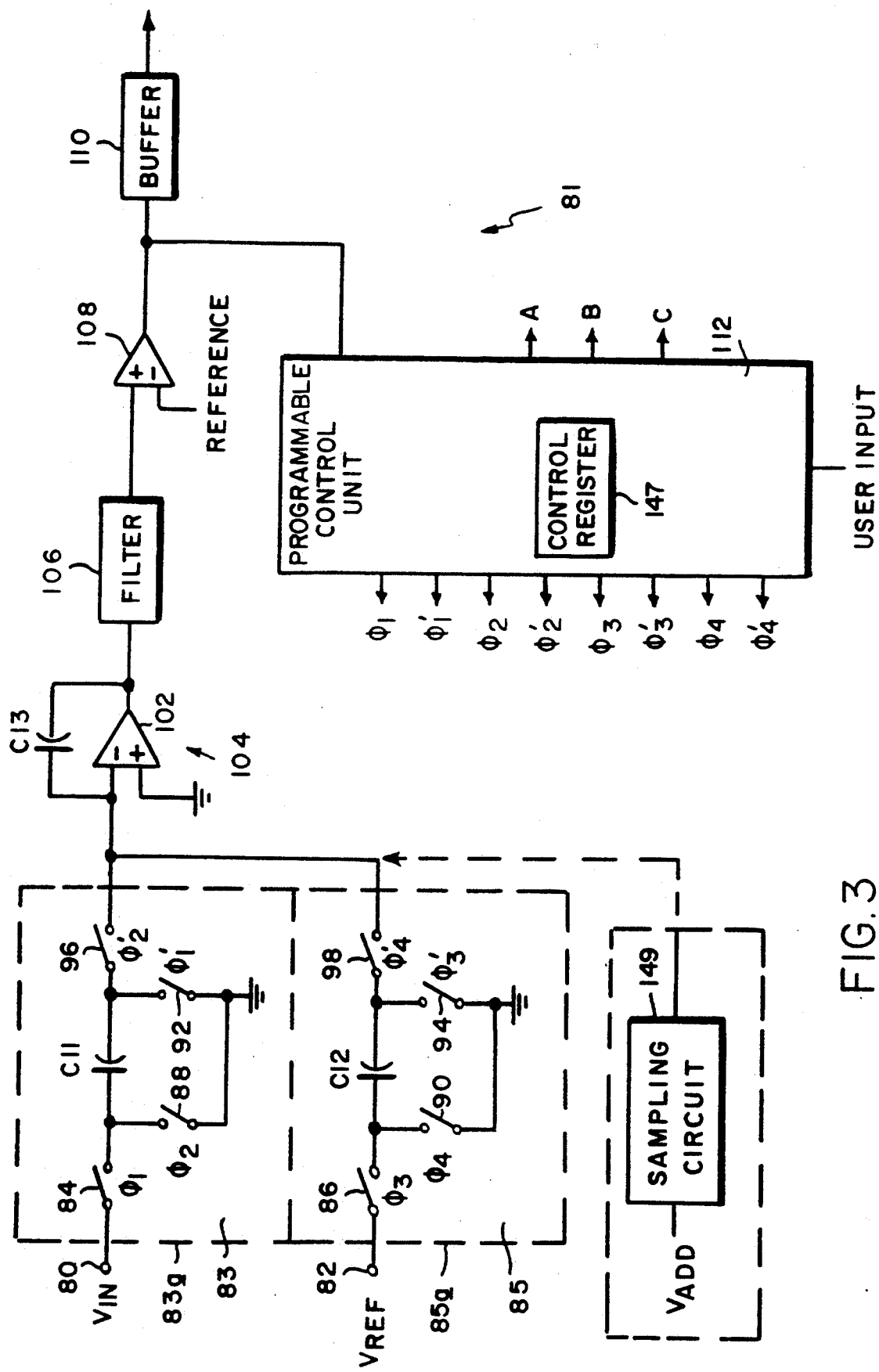
FIG. 3 is a schematic diagram of a delta sigma modulator in accordance with the present invention.

The delta sigma modulator 81 of FIG. 3 is provided with an analog input voltage $V_{in}$ at terminal 80. It is this analog input that is converted into a digital counterpart by the delta sigma modulator 81. In addition, the delta sigma modulator is provided with a reference voltage 82 denoted as $V_{ref}$ at terminal 82. This voltage is used to set the dynamic range or span of the modulator (when two reference voltages are used one reference voltage may be used to set the upper boundary of the span, and the other may be used to set the lower boundary of the span). The details of how the dynamic range of the modulator is set will be given below.

The delta sigma modulator 81 is provided with a first switched capacitor circuit 83 (shown within dashed outline 83a) and a second switched capacitor circuit 85 (shown within dashed outline 85a). The first switched capacitor circuit 83 samples charge from the input voltage $V_{in}$, whereas the second switched capacitor circuit 85 samples the reference voltage $V_{ref}$. The first switched capacitor circuit 83 includes switches 84, 88, 92, 96 and a capacitor C11. The second switched capacitor circuit 85 ma be similar in construction and, in particular, may include switches 86, 90, 94, 98 and a capacitor C12. Other embodiments, however, may be equally viable for sampling circuits. For instance, one or both sampling circuits may employ more than one capacitor, and/or may use an additional reference voltage. The output from these respective switched capacitor circuits 83 and 85 is combined at a summing node 100.

An integrator 104 is provided in the delta sigma modulator 81. The integrator 104 includes an integration capacitor C13 and an operational amplifier 102 configured in a conventional inverting integrating arrangement. This integrator 104 produces an integrated output corresponding to the net charge dumped onto the integration capacitor C13 from capacitors C11 and C12. The output from the integrator 104 passes to a conventional filter 106. The filter 106 cooperates with the integrator 104 to shape the noise at the output of the modulator, to facilitate later digital filtering of the noise. The output from the filter 106 is fed to the non inverting input of a comparator 108, whereas the inverting input of the comparator is tied to a constant voltage, labeled "Reference". (The comparator 108 may, for example, be realized as an operational amplifier as depicted in FIG. 3.) In this fashion, the comparator 108 compares the filtered integrator output with the constant reference voltage and issues a digital output indicating the results of its comparison. The digital output is fed back to a programmable control unit 112. The programmable control unit 112 utilizes the digital output to generate appropriate switch control signals and, therefore, generates feedback to stabilize the modulator 81. The control unit 112 also controls the filter 106 and the comparator 108. In particular, the programmable control unit 112 generates a number of control signals $\phi_1$, $\phi_1'$, $\phi_2$, $\phi_2'$, $\phi_3$, $\phi_3'$, $\phi_4$ and $\phi_4'$. These control signals dictate the activity of the switches within the switched capacitor circuits 83 and 85.

In addition to being forwarded to the programmable contro unit, the digital output from the comparator 108 is also forwarded to a buffer 110. The buffer 110 holds the output so that external components (not shown) may gain access to the output.

The feedback from switched capacitor circuit 85 may add either positive charge or negative charge packets at summing node 100. To add positive charge, switches 86 and 94 are closed to charge the capacitor C12 to $V_{ref}$, and switches 90 and 98 are opened. Subseguently, switches 86 and 94 are opened and switches 90 and 98 are closed to dump the positive charge packet held on the capacitor C12. In contrast, to add a negative charge packet, switches 90 and 94 are closed and switches 86 and 98 are opened. Switches 90 and 94 are then opened while switches 86 and 98 are closed.

The delta sigma modulator 81 may be provided with more than one reference voltage. For instance, as depicted in FIG. 3, an additional reference voltage $V_{add}$ may be used in conjunction with $V_{ref}$. This voltage $V_{add}$ and the sampling circuit 149 used to sample it are shown surrounded by a dashed outline to indicate that they are optional. When the additional voltage is used, the corresponding sampling circuit 149 may be like the inverting circuits 83 and 85. The control unit 112 issues control signals to the circuits 85 and 149 and dictate which, if any, reference voltage $V_{ref}$ or $V_{add}$ or is sampled at any given point in time.

Figure 1:
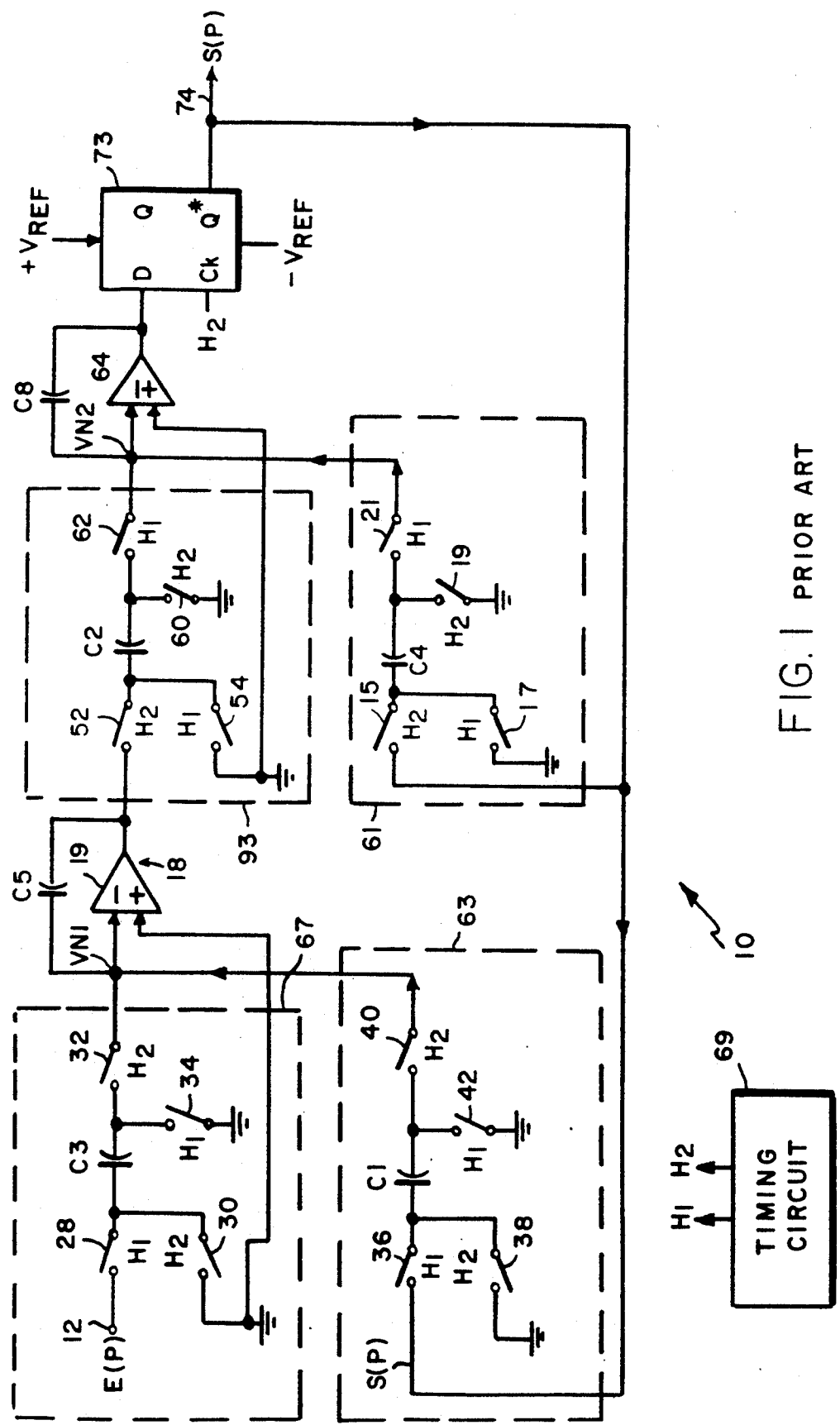
FIG. 1 is a schematic diagram of a conventional prior art delta sigma modulator.
Figure 2:
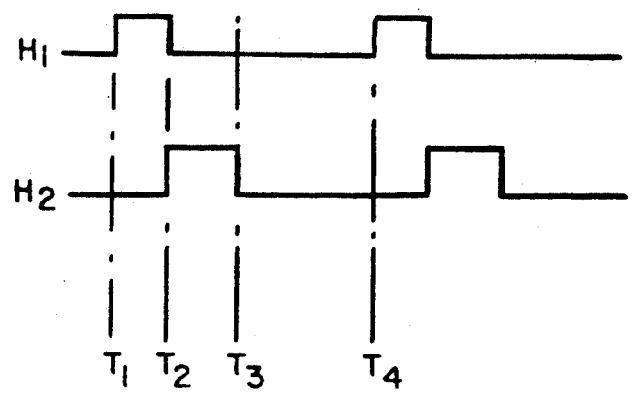
FIG. 2 is a set of timing diagrams for the control signals of the delta sigma modulator of FIG. 1.
Figure 4:
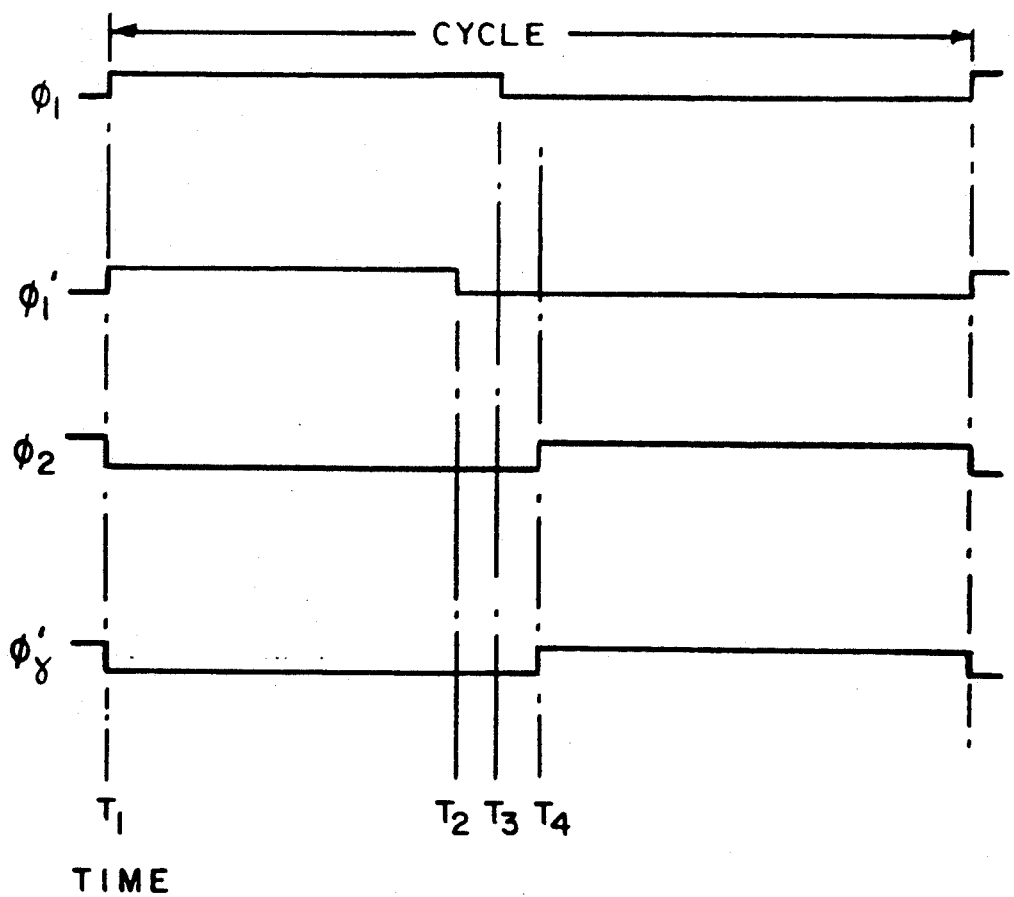
FIG. 4 is an illustrative set of timing diagrams for control signals of the delta sigma modulator of FIG. 3.

The basic operation of the delta sigma modulator 81 is now described with reference to the timing diagram of FIG. 4. The sampling of the input voltage $V_{in}$ begins by closing switches 84 and 92. This is done by initially setting the clock signals $\phi_1$ and $\phi'$ high, at time $T_1$. Please note that the times denoted as $T_i$ in FIG. 4 (where i = 1, 2 . . .) need not correspond to the times T in the other figures; rather each $T_i$ is particular to its corresponding figure. The switches 88 and 96 are set open by setting the control signals $\phi_2$ and $\phi_2'$ low, as at time $T_1$. This switch configuration causes the analog input to charge the capacitor C11.

When the capacitor C11 is fully charged, the switch 92 is opened by $\phi_1'$ going low (time $T_2$). Shortly thereafter (time $T_3$), switch 84 is opened by the control signal $\phi_1$ going low. The slight delay between the opening of switches 92 and 84 helps to eliminate charge injection error. Specifically, it ensures that the error is substantially independent of the analog input level, so that error compensation can be applied. Subsequently, at time $T_4$, switches 88 and 96 are closed by the signals $\phi_2$ and $\phi_2'$ going high. When the switches of the first switched capacitor circuit 83 are in this position, the charge accumulated in the capacitor C11 is dumped through the summing node 100 to the integration capacitor C13.

The integrator 104 integrates or accumulates the input and reference charge packets to produce an output indicative of the net charge dumped on the integration capacitor C13. The integrated output of the integrator 104 passes through the filter 106 that shapes the noise spectrum to facilitate later digital filtering. Output from the filter 106 passes to the comparator 108. This output is compared to a constant voltage, "Reference". If the voltage level of the output from the filter 106 exceeds the constant voltage, the comparator issues a digital value of "1". However, if the filtered output fails to exceed the constant voltage, the comparator 108 issues a digital output of "0". This digital output passes to the buffer 110 and also passes to the programmable control unit 112. Based on the output of comparator 108, the programmable control unit 112 determines whether a positive charge packet or a negative charge packet is added. Specifically, when a "1" output is issued, a negative charge packet is added and conversely, when a "0" output is issued, a positive charge packet is added.

As mentioned above, this delta sigma modulator 81 has the unique feature that the user can programmably select different gain settings. Specifically, the user inputs the desired level of gain/attenuation into a control register 147 of the programmable control unit 112, by use of input means not specifically illustrated in order to avoid obfuscation of the invention. Generally, the gain setting is limited to a rational value.

For illustrative purposes, suppose that a user of the delta sigma modulator 81 wishes to produce a gain of two. In that instance, the programmable control unit 112 adjusts the control signals so that the input voltage $V_{in}$ is sampled at twice the rate of the reference voltage $V_{ref}$. As such, two charge packets of analog input are dumped onto the integration capacitor C13 for each charge packet of $V_{ref}$ that is dumped onto the integration capacitor C13. If the capacitances of capacitors C12 and C11 are equal, the span or output will be twice that of what it would be if the sampling rates of analog input and $V_{ref}$ were set as equal. To properly realize a selected level of gain, the programmable control unit must know the ratio of capacitances of capacitor C12 relative to capacitor C11. The capacitances, however, need not be equal.

Figure 5:
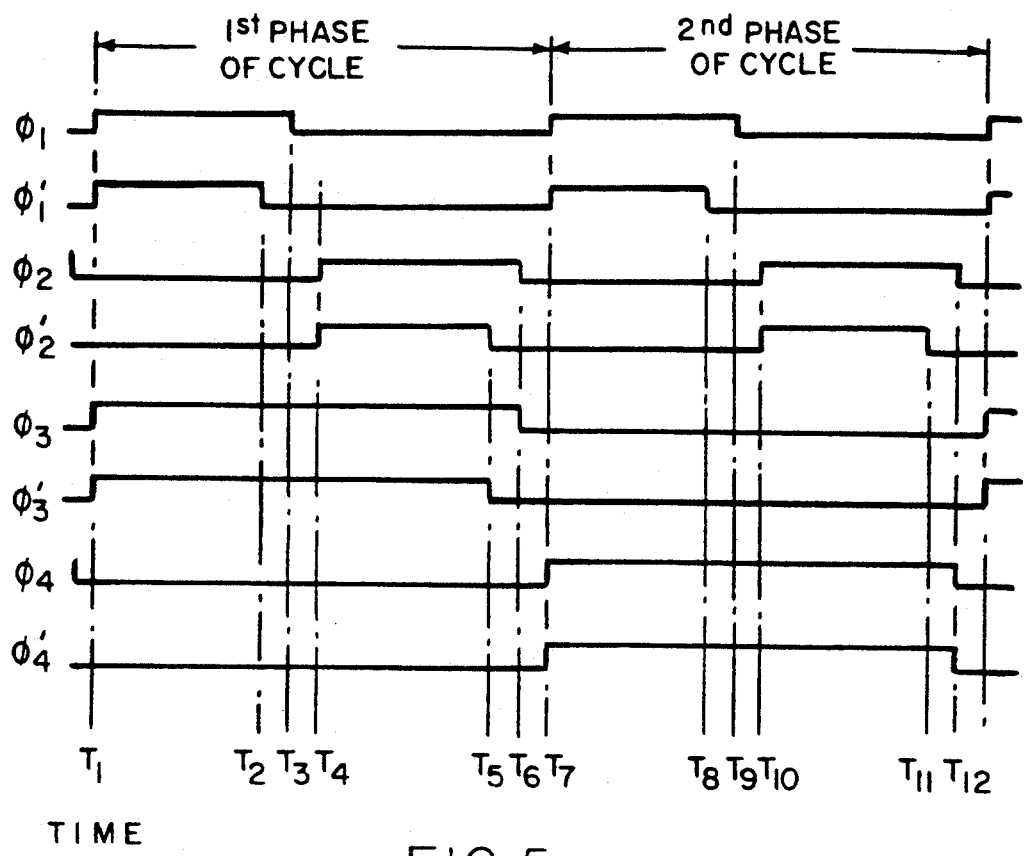
FIG. 5 is a second illustrative set of timing diagrams for the delta sigma modulator of FIG. 3 to realize a gain of two when dumping positive charge packets.

The achievement of the example level of gain will now be explained. This discussion assumes the output of the comparator 108 is "0", implying that positive charge packets are to be added by circuits. To achieve this gain, the input voltage, $V_{in}$, is sampled in a fashion such as described above but at twice the rate at which $V_{ref}$ is sampled (see FIG. 5, which illustrates the corresponding timing diagrams of the control signals for the switches in the switched capacitor circuits 83 and 85). Since an explanation has already been given for the sampling of $V_{in}$, it will not be repeated here. A description of the sampling of $V_{ref}$, however, follows.

It is helpful to view each clock cycle as having a first and second phase. During the first phase of a cycle, switches 86 and 94 in circuit 85 are initially closed at time $T_1$. In particular, control signals $\phi_3$ and $\phi_3'$ are high. At the same time, the control signals $\phi_4$ and $\phi_4'$ are low, resulting in switches 98 and 90 remaining open. In this switch configuration, capacitor C12 charges to the level of $V_{ref}$. At a point near the end of the first phase of the cycle, such as time $T_5$, switch 94 is opened by $\phi_3'$ going low. Shortly thereafter, at time $T_6$, switch 86 is opened by the control signal $\phi_3$ going low.

At the beginning of the second phase of the first clock cycle, at time $T_7$, switches 94 and 86 remain open, whereas switches 90 and 98 are closed by control signals $\phi_4$ and $\phi_4'$ going high. This switch configuration causes the dumping of the charge packet held in the capacitor C12 to integration capacitor C13.

At the beginning of this second phase of the cycle, the first switched capacitor circuit 83 repeats the sequence of events it performed during the first phase. Hence, for each cycle, the charge packet on capacitor C11 is dumped twice onto capacitor C13 for each time the charge packet on capacitor C12 is dumped on capacitor C13. Integrator 104 produces an output indicative of the net charge dumped from capacitors C11 and C12 onto capacitor C13 as previously described. Thus, it is apparent that the number of charge packets dumped per cycle from the input "leg" is twice the number of charge packets dumped from the reference "leg". Therefore the output span or dynamic range of the modulator for a given input span is twice the span realized when the sampling rates are set as equal.

Figure 6:
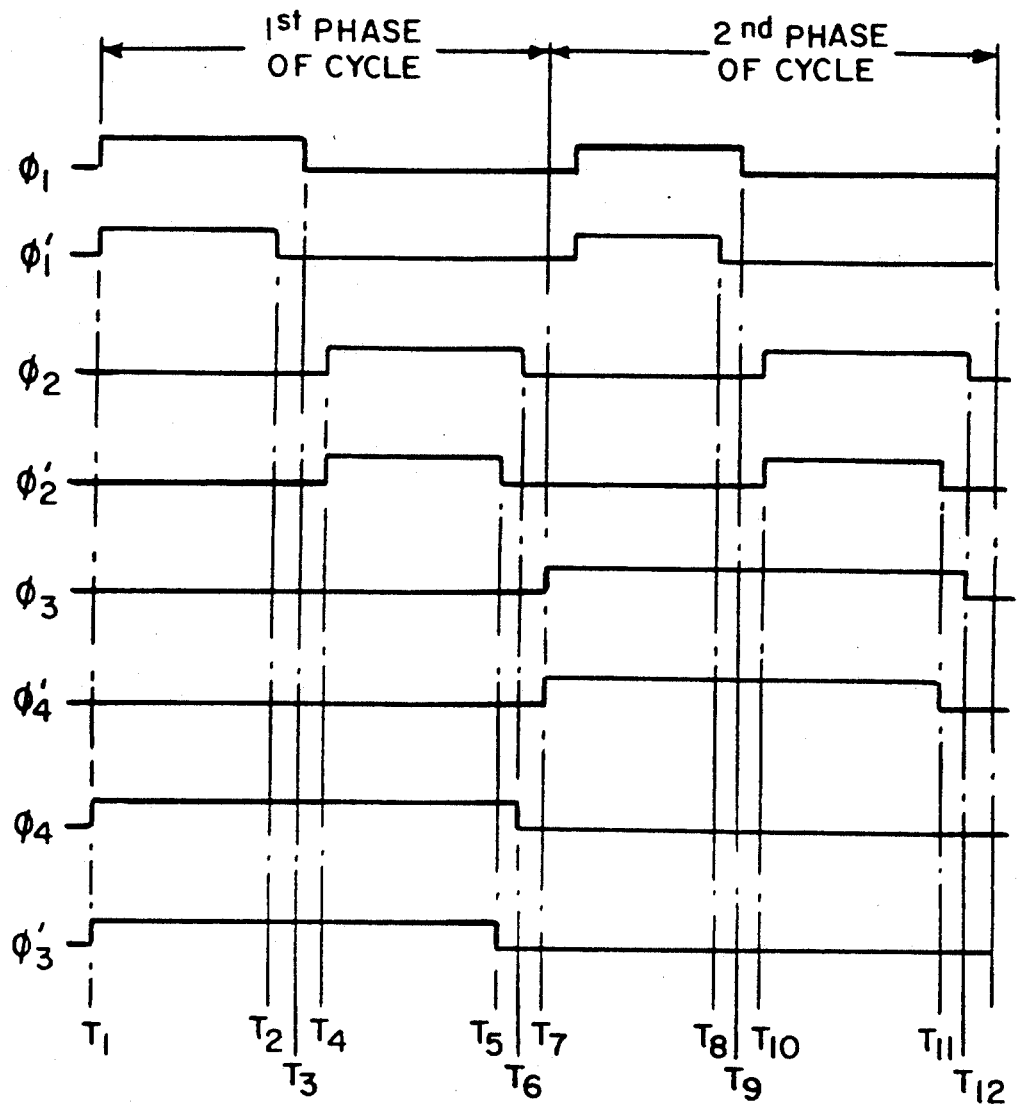
FIG. 6 is a third set of illustrative timing diagrams for the delta sigma modulator to realize a gain of two when dumping negative charge packets.

The above example assumes that the output of the comparator 108 was a "0" so that positive charge packets where forwarded to the integrator 104. In contrast, if the output of the comparator 108 is a "1", negative charge packets are added into the integrator 104. A sample timing diagram for this situation is depicted in FIG. 6 (note that the order of signals $\phi_3\phi_3'$, $\phi_4$ and $\phi_4'$ differs relative to that of FIG. 5). The timing signals $\phi_1$, $\phi_1'$, $\phi_2$ and $\phi_2'$ stay as they were in FIG. 5. The timing signals $\phi_3$, $\phi_3'$, $\phi_4$ and $\phi_4$, however, are different. Specifically, during the first phase of the cycle, the signals $\phi_3$ and $\phi_4'$ are low so that switches 86 and 98 remain open. the signals $\phi_4$ and $\phi_3'$, however, are high at time $T_1$ during the first phase of the cycle so that switches 90 and 94 are initially closed. At time $T_5$, switch 94 is opened by the $\phi_3'$ signal going low. Shortly thereafter at time $T_6$, timing signal $\phi_4$ is low to open switch 90. Subsequently, at time $T_7$, which marks the beginning of the second phase of the cycle, signals $\phi_4'$ and $\phi_3$ are high to close switches 86 and 98. This switch configuration causes the dumping of negative charge packets from the capacitor C12 to the integration capacitor C13. At times $T_{11}$ and $T_{12}$, switches 98 and 86 are opened, respectively. This pattern of control signals is repeated for each time that negative charge is dumped.

The operation of the modulator is such as to force the net charge dumped onto capacitor C13 to be zero. Hence, the gain or attenuation realized by the approach of the present invention can be expressed mathematically by looking at the charge balance equation for the modulator. The charge balance equation is as follows:

$$NC_{in}V_{in} + D(-C_{ref}V_{ref}) + (1-D)(C_{ref}V_{ref}) = 0$$

where
  N = ratio of sampling rates of the analog input to the reference voltage;
  $C_{in}$ = capacitance of capacitor C11;
  $V_{in}$ = analog input voltage;
  D = density of 1's in the output bits from comparator 108 for a sufficiently large sample of output bits;
  $V_{ref}$ = as used above; and
  $C_{ref}$ = capacitance of capacitor C12
This equation can be rearranged as $$D = (\tfrac{1}{2})(1 + N(C_{in}/C_{ref})(V_{in}/V_{ref})).$$

If $$C_{in} = C_{ref}$$

then $$D = \tfrac{1}{2}(1 + N(V_{in}/V_{ref})).$$

The gain of the system is the slope of the curve that plots D versus $V_{in}$. Hence, the gain may be expressed mathematically as a slope equation:

$$\text{Gain} = (dD)/(dv_{in}) = (N/2)(C_{in}/C_{ref})(1/v_{ref})$$

where $dD$ = change in D, $dV_{in}$ = change in $V_{in}$, and if $$C_{in} = C_{ref}$$
$$= (N/2)(1/V_{ref}).$$

Also, from the first equation given from above, gain may be expressed as $$\text{Gain} = (D_{max} - D_{min})/(Vin_{max} - Vin_{min})$$
$$\text{or} = (\text{output span}) - (\text{input span})$$

where
- $D_{max}$ = maximum value of D,
- $D_{min}$ = minimum value of D,
- $Vin_{max}$ = maximum value of Vin, and
- $Vin_{min}$ = minimum value of Vin.

It is apparent from the above equations that the gain across the modulator is dictated in large part by the sampling rate ratio N and that even with fixe $V_{ref}$, for any $V_{in}$, the output will scale with N. Specifically, an increase in N will produce an increase in D and a decrease in N will produce a decrease in D. Thus, in choosing an appropriate value for N, one can select the gain/attenuation of the modulator.

The timing of the switches may also be adjusted by the programmable control unit 112 to produce attenuation. In this fashion, charge on capacitor C12 for the reference leg is dumped more frequently per cycle than the charge held on capacitor C11 for the input leg. Thus, a user of the delta sigma modulator 81 may select a particular gain or attenuation that is most suitable for their purposes. The selection merely requires the programming of an appropriate gain. It does not required the changing of capacitors within the delta sigma modulator.

Figure 8:
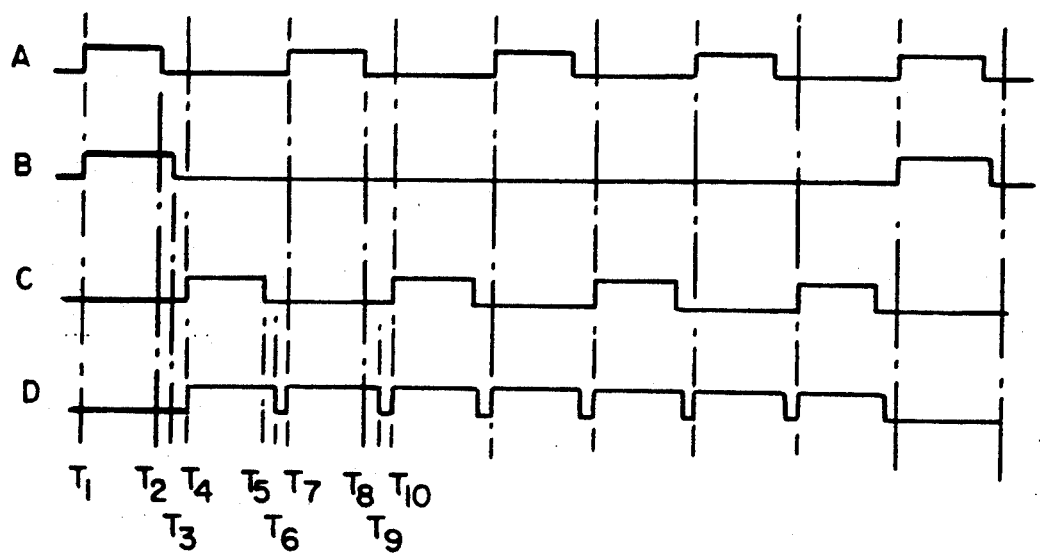
FIG. 8 is a timing diagram of the control signals for the attenuation circuit of FIG. 7.
Figure 7:
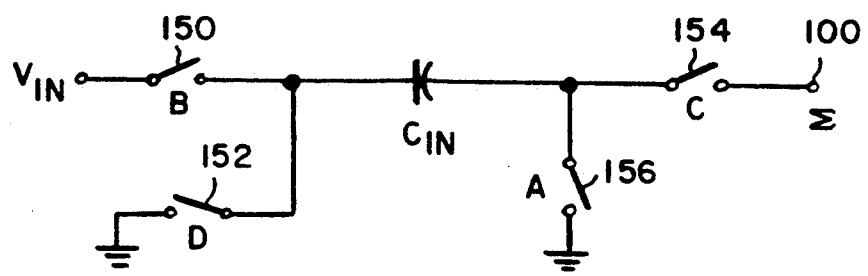
FIG. 7 is a schematic diagram of an attenuation circuit used to attenuate the analog input to the delta sigma modulator.

Attenuation or gain may also be realized by interspersing charge packets of a known charge level with the analog input charge packets or with the reference voltage charge packets. FIG. 7 depicts an input leg which may be utilized to precisely attenuate the analog input. The basic approach adopted by this configuration is to mix packets of charge dumped from the capacitor Cin with ground (i.e., packets of zero charge) so that the resulting integrated output from the integrator 104 (FIG. 3) is attenuated. The input leg of FIG. 7 includes switches 150, 152, 154 and 156 and a capacitor $C_{in}$. The switches 150, 152, 154, and 156 are controlled by control signals B, D, C and A (as shown in FIG. 8), respectively, issued from the programmable control unit 112 (FIG. 3).

An illustration is helpful in explaining how the attenuation process is realized in accordance with this approach. Initially, at time $T_1$, control signals A and B are high to close switches 156 and 150, respectively. At the same time, signals C and D are low to open switches 154 and 152, respectively. In this configuration, the capacitor $C_{in}$ is charged by current flowing from the input voltage $V_{in}$. The dropping of signal A to a low level at time $T_2$ and the dropping of signal B to a low level (at time $T_3$) results in the opening of switches 156 and 150, respectively. The time delay between $T_3$ and $T_4$ is provided to eliminate the change injection problem. At time $T_4$, switches 152 and 154 are closed by control signals D and C going high. This causes the discharging of the capacitor $C_{in}$ through the summing junction 100.

Next, signals C and D are set low at times $T_5$ and $T_6$, respectively, resulting in the opening of switches 154 and 152. At time $T_7$, switch 156 is closed, but switch 150 remains open. Instead of switch 150 closing, switch 152 is closed by signal D going high. At time $T_8$, signal A goes low, opening switch 156, and, at time $T_9$, signal D goes low, causing switch 152 to open. However, at time $T_{10}$, the signal D is high again, causing the closing of switch 152. The capacitor $C_{in}$ is, thus, charged to ground and is discharged when at time $T_{10}$ the C signal is high. This forwarding of samples of ground potential (i.e. zero charge) occurs three additional times on the alternate high portions of the D cycle. As a result three packets of zero charge are mixed in with one sample of $V_{in}$. The net result is that the integrated output signal is one fourth what it would have been if the input had been sampled directly each time (i.e., there is an attenuation by four).

The above example is intended to be merely illustrative. It should be appreciated that other levels of attenuation are realizable by the same scheme. For instance, attenuation of two, three, seven, etc. may be equally realized. Moreover, voltage other than ground may be summed with the analog input. In this fashion, different levels of gain, attenuation or charge balancing may be realized.

While the present invention has been described with reference to a preferred embodiment thereof which is presented by way of example only, it will be apparent to those skilled in the art that various changes in form and detail may be made without departing from the spirit and scope of the invention. For instance, multiple reference voltages may be used instead of a single reference voltage. Also the described preferred embodiment is single ended but could be fully differential in nature (i.e., the amplifier could have inverting and non-inverting outputs and there could be, in addition, twice the number of integration capacitors and switched capacitor circuits). The examples are, thus, not intended to be limiting and the invention is defined only in the appended claims.

We claim:

1. A delta sigma modulator for converting an analog input into digital output, comprising:

a) an integrating amplifier circuit, having an integration capacitor, for producing output indicative of an amount of charge held on the integration capacitor;

b) means for sampling the analog input to produce analog input packets of charge and for transferring said analog input packets of charge to said integration capacitor in correspondence with a first control signal supplied at a first rate;

c) means for sampling a reference voltage at a second rate to produce reference packets of charge and for transferring said reference packets of charge to said integration capacitor in correspondence with a second control signal supplied at a second rate; and
d) a programmable control means for selecting the ratio of the control signals, from among a plurality of available rates, responsive to a gain selection decision communicated to the controls means so that gain is realized across the delta sigma modulator.

2. A delta sigma modulator as recited in claim 1 wherein the means for sampling the analog input comprises a sampling capacitor for holding analog input packets of charge.

3. A delta sigma modulator as recited in claim 1 wherein the means for sampling the reference voltage comprises a sampling capacitor for holding analog input packets of charge.

4. A delta sigma modulator as recited in claim 1 wherein the programmable control means selects the rates of the control signals so that the first rate is greater than the second rate.

5. A delta sigma modulator as recited in claim 1 wherein the programmable control means selects the rates of the control signals so that the first rate is less than the second rate.

6. A delta sigma modulator as recited in claim 1 wherein the programmable control means selects the rates of the control signals so that the first rate is substantially equal to the second rate.

7. A delta sigma modulator as recited in claim 1 further comprising means for sampling a second reference voltage to produce second reference packets of charge and means for transferring second reference packets of charge to the ration capacitor.

8. A delta sigma modulator, comprising:
a) an integrating amplifier circuit comprising:
1) an integration capacitor having first and second electrical leads; and
2) an amplifier, wherein the output of the amplifier is connected to the first electrical lead of the integration capacitor, and an input of the amplifier is connected to the second electrical lead of the integration capacitor;
b) a first switched capacitor circuit comprising:
1) a first input terminal for receiving an analog input;
2) means responsive to at least one control signal for controlling the charging of a first sampling capacitor to the level of an analog input voltage and for controlling the discharging of the first sampling capacitor to the integration capacitor so that the analog input is sampled at a first rate;
c) a second switched capacitor circuit, comprising:
1) a second input terminal for receiving a known reference voltage;
2) means responsive to at least one control signal for controlling the charging of a second sampling capacitor to the level of a known reference voltage and for controlling the discharging of said second sampling capacitor to the integration capacitor so that the reference voltage is sampled at a second rate; and
d) control means for generating said control signals which control the rates of sampling to generate a level of gain specified by a gain selection decision communicated to the control means.

9. A delta sigma modulator as recited in claim 8, further comprising a filter connected to the output of the integrating amplifier circuit for aiding in shaping of the noise spectrum.

10. A delta sigma modulator as recited in claim 8 wherein the control means generates said control nals so that first rate of sampling is set greater than the second rate of sampling.

11. A delta sigma modulator as recited in claim 8 wherein the control means generates said control signals so that first rate of sampling is set lower than the second rate of sampling.

12. A delta sigma modulator as recited in claim 8 wherein the control means generates said control signals so that first rate of sampling is set substantially equal to the second rate.

13. A delta sigma modulator as recited in claim 8 wherein the capacitance of the first sampling capacitor is substantially equal to the capacitance of the second sampling capacitor.

14. A delta sigma modulator as recited in claim 8 further comprising an additional switched capacitor circuit for sampling an additional reference voltage and for forwarding said samples of the additional reference voltage to the integrating amplifier circuit.

15. A method of realizing a desired level of gain in a delta sigma modulator having an integrating amplifier circuit, having an integration capacitor and an amplifier wherein a first electrical lead of the integration capacitor is coupled to the output of the amplifier and a second electrical lead of the integration capacitor is coupled to an input of the amplifier, comprising the steps of:
a) sampling an analog input to produce analog input samples and transferring said analog input samples to the integration capacitor of the integrating amplifier circuit at a first rate;
b) sampling a known reference voltage to produce reference voltage samples and transferring said reference voltage samples to the integration capacitor at a second rate, said first and second rate being selected to effect the desired level of gain.

16. A method as recited in claim 15 wherein the first rate reater than the second rate.

17. A method as recited in claim 15 wherein the first rate is less than the second rate.

18. A method as recited in claim 15 wherein the first rate is substantially equal to the second rate.

19. A method of realizing gain in a delta sigma modulator, said delta sigma modulator having, a means for sampling an input, a means for sampling a fixed voltage and an integrating amplifier circuit having an amplifier and an integration capacitor wherein a first electrical lead of the integration capacitor is coupled to the output of the amplifier and a second electrical lead of the capacitor is coupled to an input of the amplifier, comprising the steps of:
a) sampling an analog input to charge packets of input and transferring the charge packets of input to the integration capacitor at a first rate;
b) sampling the fixed voltage to produce fixed charge packets and transferring the fixed charge packets to the integration capacitor at a second rate to induce gain; and
c) producing an output from the integrating amplifier indicative of the amount of charge transferred to the integration capacitor.

20. A method as recited in claim 19 wherein the fixed voltage is a ground potential.

21. A method as recited in claim 19 wherein the fixed voltage is a positive voltage.

22. A method as recited in claim 19 wherein the fixed voltage is a negaitive voltage.

23. A method as recited in claim 19 wherein the input is an analog input to be converted into digital form by the modulator.

24. A method as recited in claim 19 wherein the input is a reference voltage having a known voltage.

25. A delta sigma modulator, comprising:
 a) an integrating amplifier circuit, having an amplifier and an integration capacitor, for producing an output indicative of an amount of charge held on said capacitor, wherein the output of the integration capacitor is coupled to a first electrical lead of the integration capacitor and the second electrical lead of the integration is coupled to an input of the amplifier;
 b) means for sampling an input to produce packets of charge of input and for transferring said packets of charge of input to the integration capacitor;
 c) means for sampling a fixed voltage to produce fixed packets of charge and for transferring said fixed packets of charge to the integration capacitor; and
 d) an adjustable control means for controlling how many of packets of charge of input are sent to the integration capacitor of the integrating amplifier circuit and how many fixed packets of charge are sent to the integration capacitor.

26. A delta sigma modulator as recited in claim 25 wherein the fixed voltage is set at a ground potential.

27. A delta sigma modulator as recited in claim 25 wherein the fixed voltage is a positive voltage.

28. A delta sigma modulator as recited in claim 25 wherein the fixed voltage is a negative voltage.

29. A delta sigma modulator as recited in claim 25 wherein the input is an analog input to be converted into digital form by the modulator.

30. A delta sigma modulator as recited in claim 25 wherein the input is a reference voltage having a known voltage.

31. A delta sigma modulator for converting analog input into digital output, comprising:
 a) an integrating amplifier circuit, having an integration capacitor, for producing output indicative of an amount of charge held on the integration capacitor;
 b) means for sampling the analog input to produce analog input packets of charge and transferring said analog input packets of charge to said integration capacitor, said means for sampling the analog input receiving a first control signal that dictates how many analog input charge packets are transferred to the integration capacitor over a predetermined time;
 c) means for sampling the reference voltage to produce reference packets of charge and for transferring said reference packets of charge to said integration capacitor, said means for sampling the reference voltage receiving a second control signal that dictates how many reference charge packets are transferred to the integration capacitor over the predetermined time; and
 d) control means for generating said control signals so that a fixed ratio of analog input charge packets to reference charge packets is sent to the integration capacitor over the predetermined time to effect a level of gain, said level of gain being communicated to said control means.

32. A delta sigma modulator as recited in claim 31 further comprising a means for a user to select a desired level of ain and means for communicating said desired level of gain to said control means.

* * * * *